United States Patent
Ogiwara et al.

(10) Patent No.: US 7,092,304 B2
(45) Date of Patent: Aug. 15, 2006

(54) SEMICONDUCTOR MEMORY

(75) Inventors: Ryu Ogiwara, Yokohama (JP); Daisaburo Takashima, Yokohama (JP); Thomas Roehr, Munich (DE)

(73) Assignees: Kabushiki Kaisha Toshiba, Tokyo (JP); Infineon Technologies AG, Munich (DE)

( * ) Notice: Subject to any disclaimer, the term of this patent is extended or adjusted under 35 U.S.C. 154(b) by 13 days.

(21) Appl. No.: 10/931,978

(22) Filed: Sep. 2, 2004

(65) Prior Publication Data

US 2005/0276140 A1 Dec. 15, 2005

(30) Foreign Application Priority Data

May 28, 2004 (JP) .............................. 2004-159758

(51) Int. Cl.
*G11C 7/04* (2006.01)
(52) U.S. Cl. ...................................... 365/212; 327/108
(58) Field of Classification Search ................ 365/212; 327/108
See application file for complete search history.

(56) References Cited

U.S. PATENT DOCUMENTS 5,424,975 A * 6/1995 Lowrey et al. ............. 365/145
5,798,637 A * 8/1998 Kim et al. ................... 323/313
6,198,652 B1 * 3/2001 Kawakubo et al. ......... 365/145
6,605,968 B1 * 8/2003 Huber et al. ................ 327/108
2003/0174001 A1 * 9/2003 Huber et al. ................ 327/108

FOREIGN PATENT DOCUMENTS

JP 2003-68070 3/2003

OTHER PUBLICATIONS

U.S. Appl. No. 10/291,610, filed Nov. 12, 2002, Ogiwara et al.

* cited by examiner

*Primary Examiner*—Michael Tran
(74) *Attorney, Agent, or Firm*—Oblon, Spivak, McClelland, Maier & Neustadt, P.C.

(57) ABSTRACT

A dummy capacitor drive potential VDC is given to one electrode of a dummy capacitor, and a reference potential for determining a data value of a memory cell is generated in the other electrode thereof. A potential generator circuit for generating the potential VDC is composed of a BGR circuit outputting a potential VBGRTEMP having temperature dependency, and resistors R3 and R4, which are series-connected between an output terminal of the BGR circuit and a ground point. The potential VDC is output from a connection point of the resistors R3 and R4. Temperature dependency of the potential VDC is adjusted based on a resistance ratio of resistors R1-1, R1-2 and R2, and the absolute value is adjusted based on a resistance ratio of resistors R3 and R4.

20 Claims, 13 Drawing Sheets

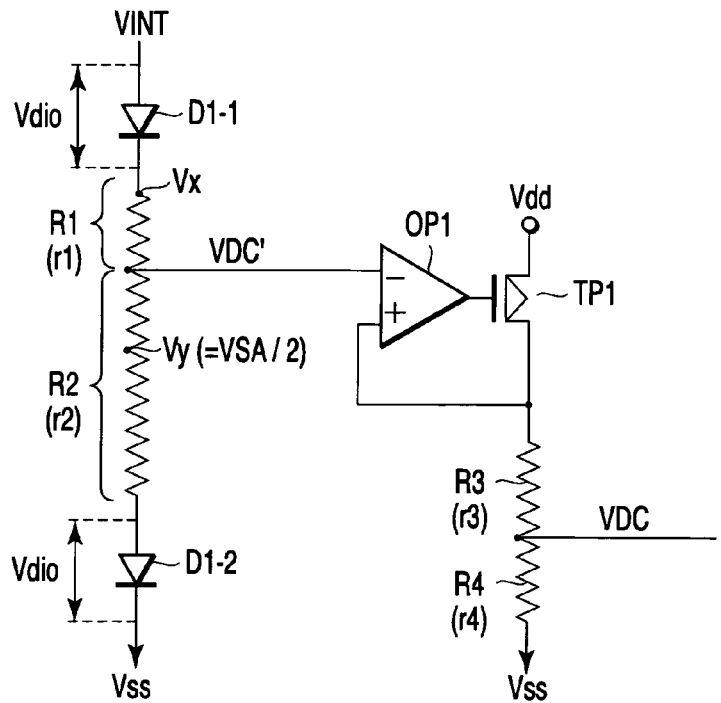
F I G. 2 0
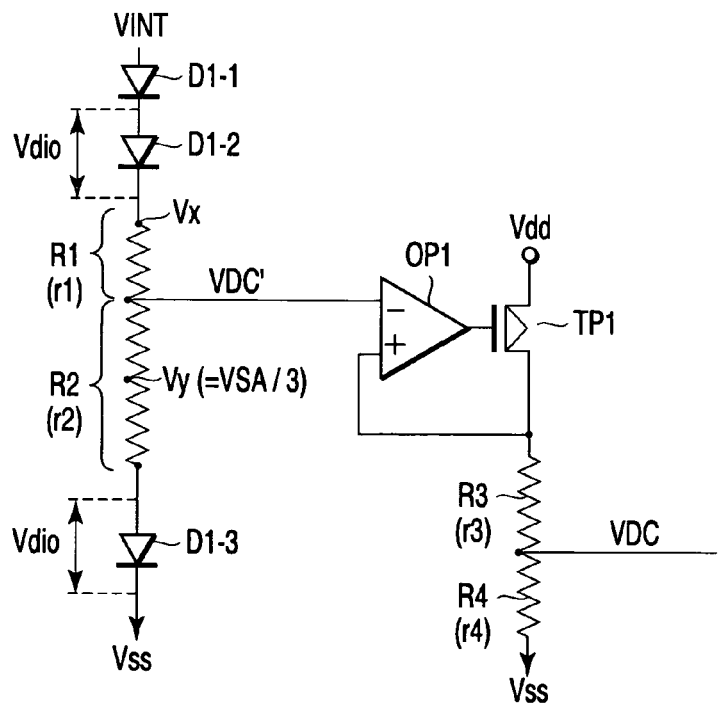
F I G. 2 1

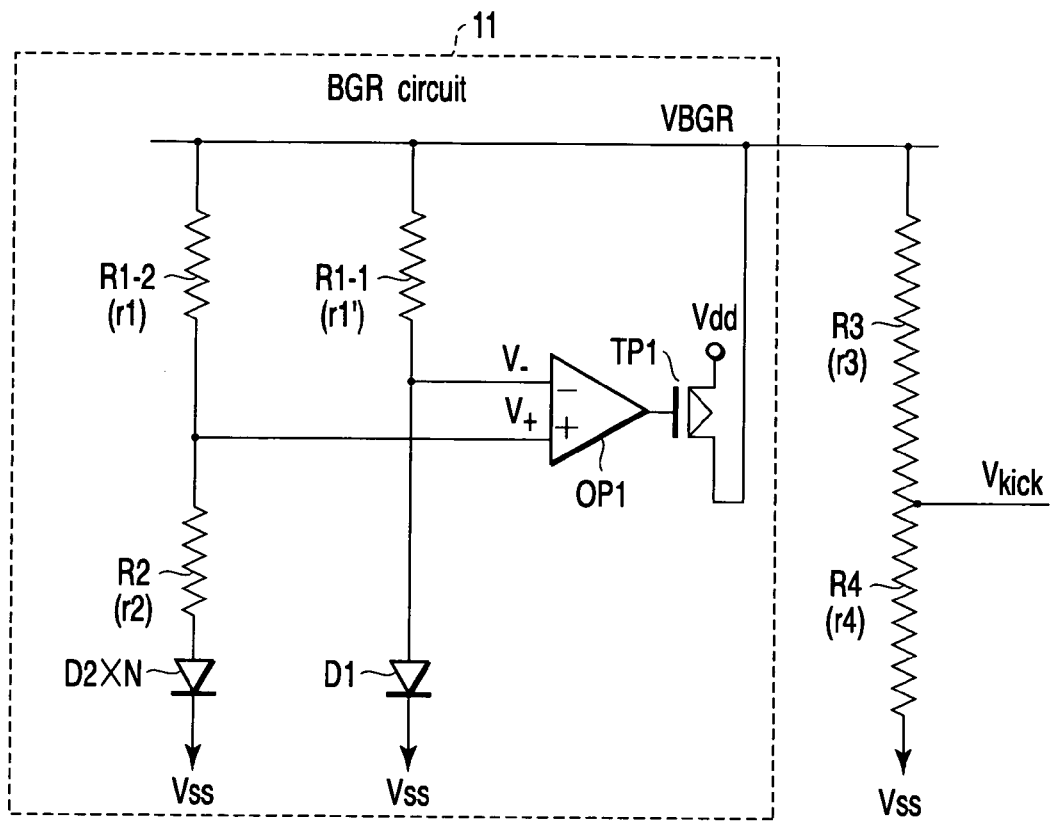
F I G. 25

SEMICONDUCTOR MEMORY

CROSS-REFERENCE TO RELATED APPLICATIONS

This application is based upon and claims the benefit of priority from prior Japanese Patent Application No. 2004-159758, filed May 28, 2004, the entire contents of which are incorporated herein by reference.

BACKGROUND OF THE INVENTION

1. Field of the Invention

The present invention relates to a potential generator circuit of a semiconductor memory. In particular, the present invention relates to a sense amplifier reference potential generator circuit of a memory using a ferroelectric capacitor.

2. Description of the Related Art

Conventionally, a sense amplifier reference potential used for a semiconductor memory, for example, ferroelectric memory, has kept a constant value, which does not depend on temperature. Thus, the study of giving a desired temperature dependency to the potential has not been made.

A BGR circuit has been conventionally used only for generating a reference potential having no temperature dependency. As shown in FIG. 1 and FIG. 2, it has been known that the area or resistance ratio of a diode is varied, thereby obtaining an output potential having temperature dependency. However, it is difficult to independently control the temperature dependency and its absolute value. There is the following problem; more specifically, if high temperature dependency is set, the absolute value also becomes large, as seen from FIG. 3.

For example, the following technique is desired in the field of ferroelectric memory. Temperature dependency is given to a sense amplifier reference potential in accordance with ferroelectric thin film characteristics, and the temperature dependency and the absolute value are independently controlled in their setting.

BRIEF SUMMARY OF THE INVENTION

According to an aspect of the present invention, there is provided a semiconductor memory comprising:

a circuit for reading a data from a memory cell to one of a complementary bit line pair, and giving a reference potential for determining a value of the data to the other thereof; and a potential generator circuit for giving temperature dependency to the reference potential based on a potential having temperature dependency, the potential generator circuit independently controlling an absolute value and temperature dependency of the reference potential.

BRIEF DESCRIPTION OF THE SEVERAL VIEWS OF THE DRAWING

FIG. 20 is a circuit diagram showing a potential generator circuit according to a seventh embodiment of the present invention;

FIG. 21 is a circuit diagram showing a potential generator circuit according to an eighth embodiment of the present invention;

FIG. 25 is a circuit diagram showing a potential generator circuit according to a tenth embodiment of the present invention.

DETAILED DESCRIPTION OF THE INVENTION

A semiconductor memory of an aspect of the present invention will be described below in detail with reference to the accompanying drawings.

1. Outline

According to the present invention, the potential difference between a pair of bit lines is amplified using a sense amplifier in a 1T1C-type FeRAM. In this case, temperature dependency is given to a dummy capacitor drive potential VDC for generating a reference potential given to one of the bit lines.

For example, the dummy capacitor drive potential VDC is set as a low value at low temperature while being set as a high value at high temperature.

On the other hand, peripheral circuits such as row decoder, column decoder and address buffer are supplied with a potential having no temperature dependency to always keep a constant value with respect to a temperature change.

In this case, the absolute value of the dummy capacitor drive potential VDC is independently controlled considering various characteristics of a ferroelectric capacitor of a memory cell. The various characteristics include area, film thickness and variations in the ratio of ferroelectric and paraelectric components, in particular. In addition, there is a possibility that temperature dependency is variable; for this reason, the temperature dependency must be controlled.

Sense amplifier supply potential and plate drive potential have a positive correlation with a hysteresis curve. For this reason, the dummy capacitor drive potential VDC needs to have a positive correlation with these potentials.

The present invention proposes the following technique as seen from the embodiments described later. According to the technique, temperature dependency is given to sense amplifier reference potential, that is, dummy capacitor drive potential VDC, and the temperature dependency and the absolute value are independently controlled. In addition, a positive correlation is given between dummy capacitor drive potential VDC and sense amplifier supply potential or plate drive potential.

2. Fundamental Concept

Figure 1:
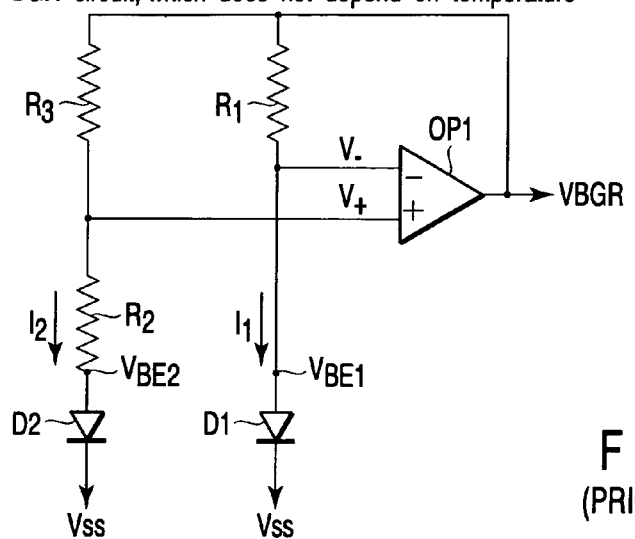
FIG. 1 is a circuit diagram showing a BGR circuit for generating a VBGR, which does not depend on temperature.
Figure 2:
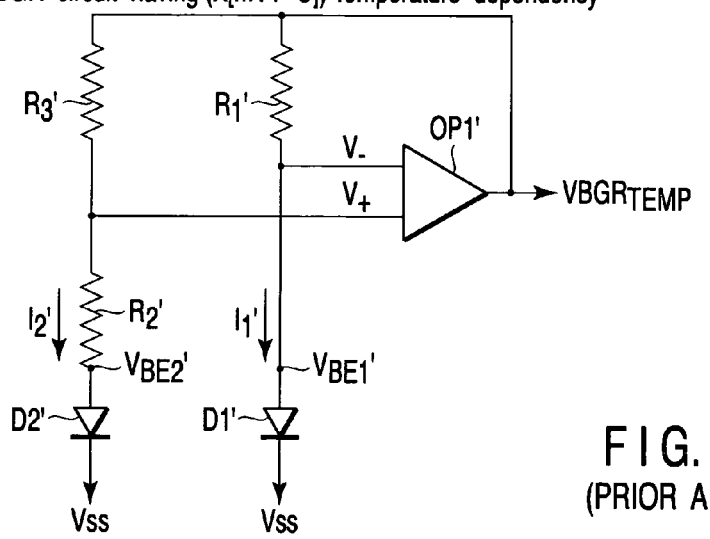
FIG. 2 is a circuit diagram showing a BGR circuit for generating a VBGRTEMP having temperature dependency.
Figure 3:
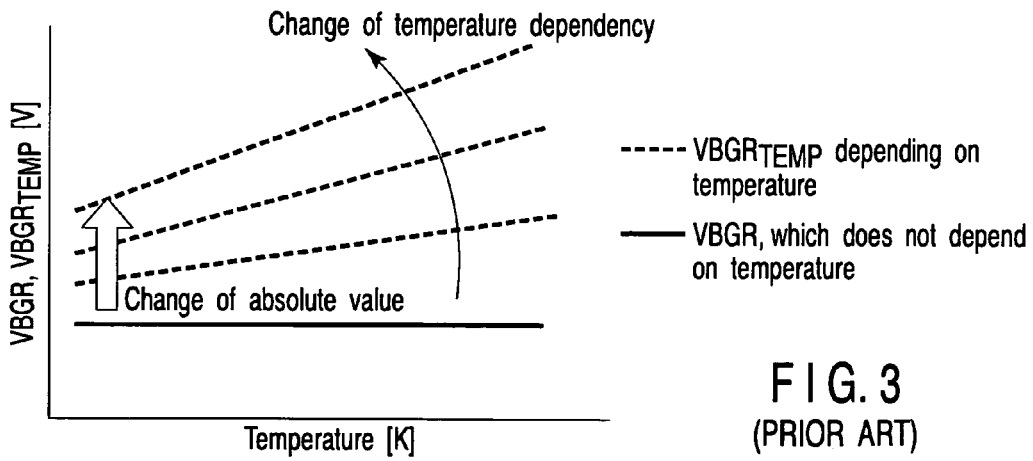
FIG. 3 is a graph to explain individual changes of temperature dependency and absolute value in a conventional BGR circuit.
Figure 4:
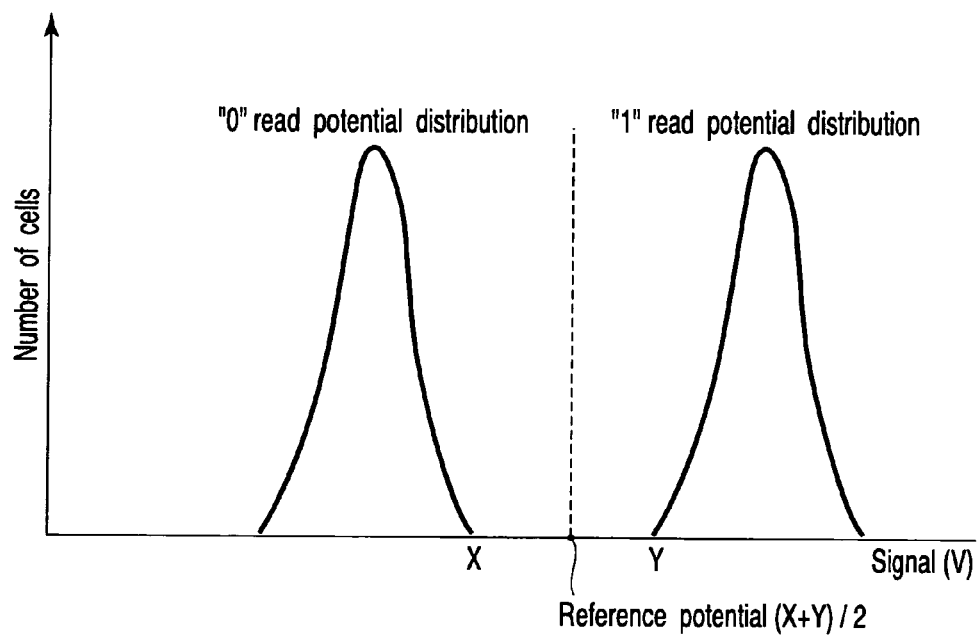
FIG. 4 is a graph to explain "0"/"1" read potential distributions of a ferroelectric memory.

FIG. 4 shows "0" and "1" read potential distributions in a ferroelectric memory.

The following value is given as an ideal sense amplifier reference potential. The value is an intermediate value of the foot (maximum value) X of the "0" read potential distribution and the foot (minimum value) Y of the "1" read potential distribution, that is, (X+Y)/2.

Here, each temperature dependency of the maximum value X of the "0" read potential distribution and the minimum value Y of the "1" read potential distribution will be explained below.

Figure 5:
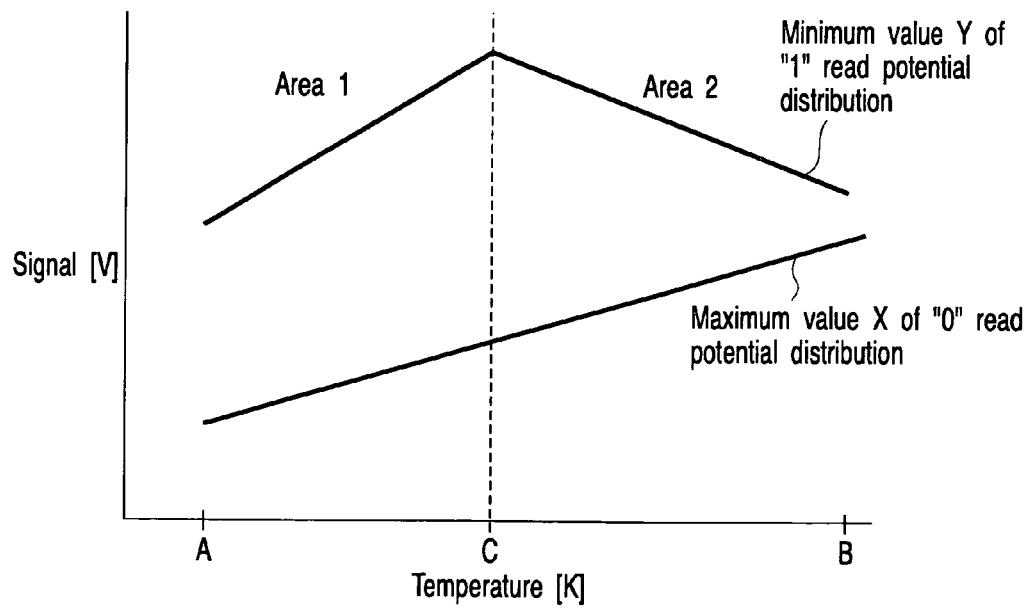
FIG. 5 is a chart to explain a change of temperature on each critical region of the distribution curves of the "0"/"1" read potential distributions.

As seen from FIG. 5, the maximum value X of the "0" read potential distribution increases proportional to the rise of temperature. On the contrary, the minimum value Y of the "1" read potential distribution has the following change in two areas 1 and 2 divided by a predetermined temperature C[K]. More specifically, the value increases with the rise of temperature in a range (area 1) lower than the predetermined temperature, while it decreases with the rise of temperature in a range (area 2) higher than that.

In the foregoing distribution, the maximum value X of the "0" read potential distribution increases with the rise of temperature, and the minimum value Y of the "1" read potential distribution decreases with the rise of temperature in the area 2. This is because the residual polarization of ferroelectric capacitor decreases depending on the rise of temperature.

In the foregoing distribution, the minimum value Y of the "1" read potential distribution increases proportional to the rise of temperature in the area 1. This is because coercive voltage decreases with the rise of temperature, that is, a signal increases judging from the operation point analysis.

Figure 6:
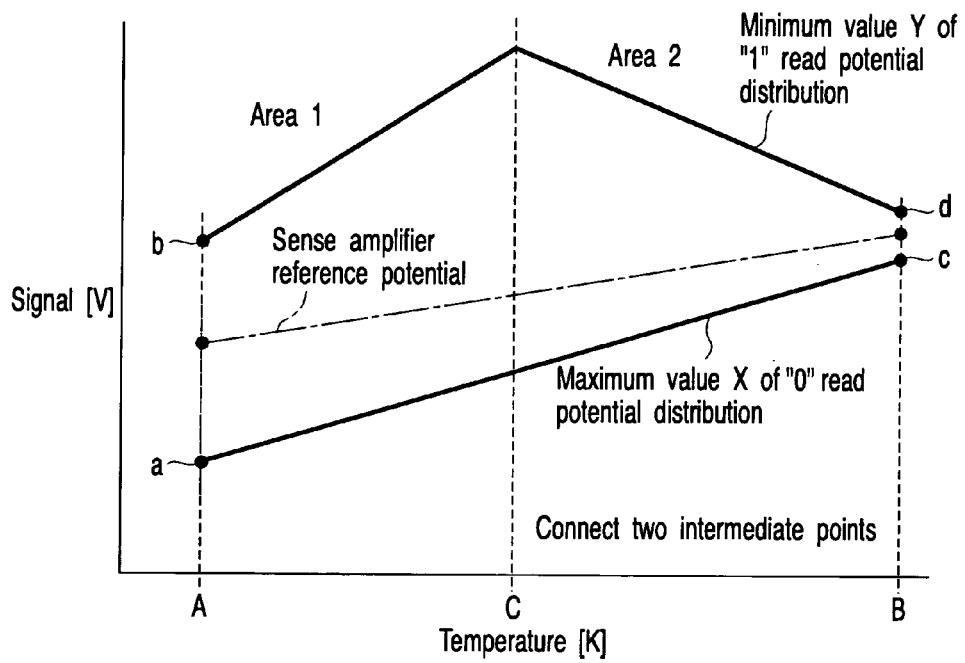
FIG. 6 is a chart to explain the method of setting temperature dependency of a sense amplifier reference potential.

FIG. 6 shows the method of simply securing the maximum margin between sense amplifier reference potential and low/high level signal distribution in a specified temperature range (A[K]<T<B[K]).

According to the foregoing method, temperature dependency is set that the sense amplifier reference potential is variable on the straight line connecting two intermediate values between points a and b and between points c and d given below. More specifically, the points a and b are the maximum value X of the "0" read potential distribution and the minimum value Y of the "1" read potential distribution in the lowest temperature, that is, temperature A[K], respectively. On the other hand, the points c and d are the maximum value X of the "0" read potential distribution and the minimum value Y of the "1" read potential distribution in the highest temperature, that is, temperature B[K], respectively.

Figure 7:
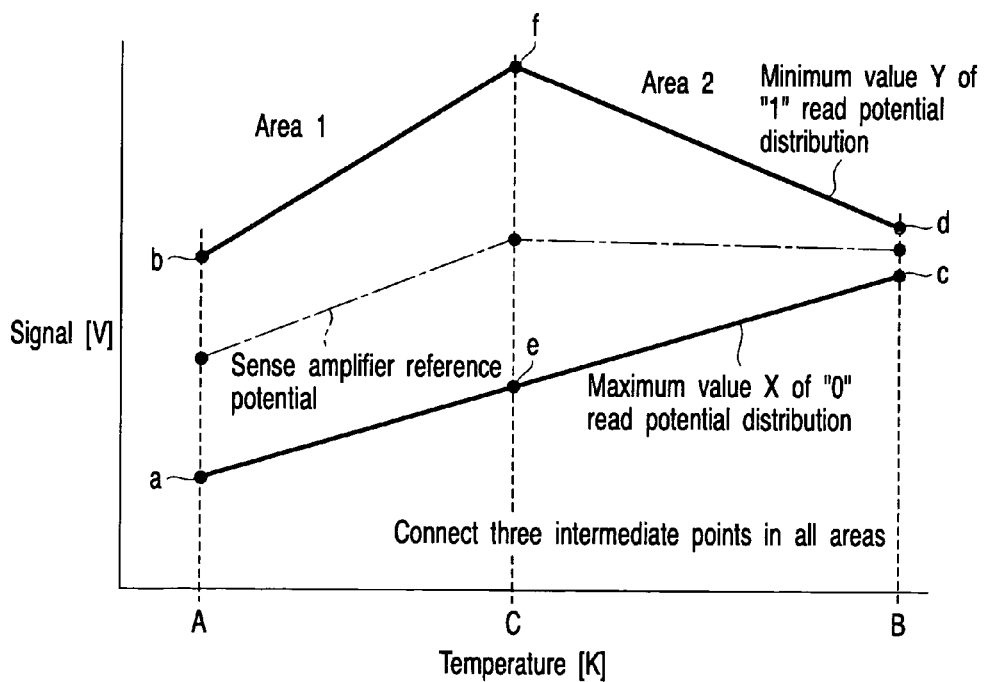
FIG. 7 is a chart to explain the method of setting temperature dependency of a sense amplifier reference potential.

FIG. 7 shows another method of securing the maximum margin between sense amplifier reference potential and low/high level signal distribution in all of a temperature range (A[K]<T<B[K]).

According to the foregoing method, temperature dependency is set that the sense amplifier reference potential changes on the straight line connecting three intermediate values between points a and b, points e and f, and points c and d given below. More specifically, the points a and b is the maximum value X of the "0" read potential distribution and the minimum value Y of the "1" read potential distribution in the lowest temperature, that is, temperature A[K], respectively. Further, the points e and f is the maximum value X of the "0" read potential distribution and the minimum value Y of the "1" read potential distribution in temperature C[K], respectively. Further, the points c and d are the maximum value X of the "0" read potential distribution and the minimum value Y of the "1" read potential distribution in the highest temperature, that is, temperature B[K], respectively.

The foregoing method is employed; as a result, the line showing the temperature dependency of the sense amplifier reference potential is bent at the temperature C[K].

Even if any of the foregoing two methods is employed, non-uniformity occurs in the performance of the ferroelectric thin film of the ferroelectric capacitor. In order to prevent non-uniformity in memory chip characteristic, both temperature dependency and absolute value of the sense amplifier reference potential must be independently controlled.

3. EMBODIMENTS (1) First Embodiment

Figure 8:
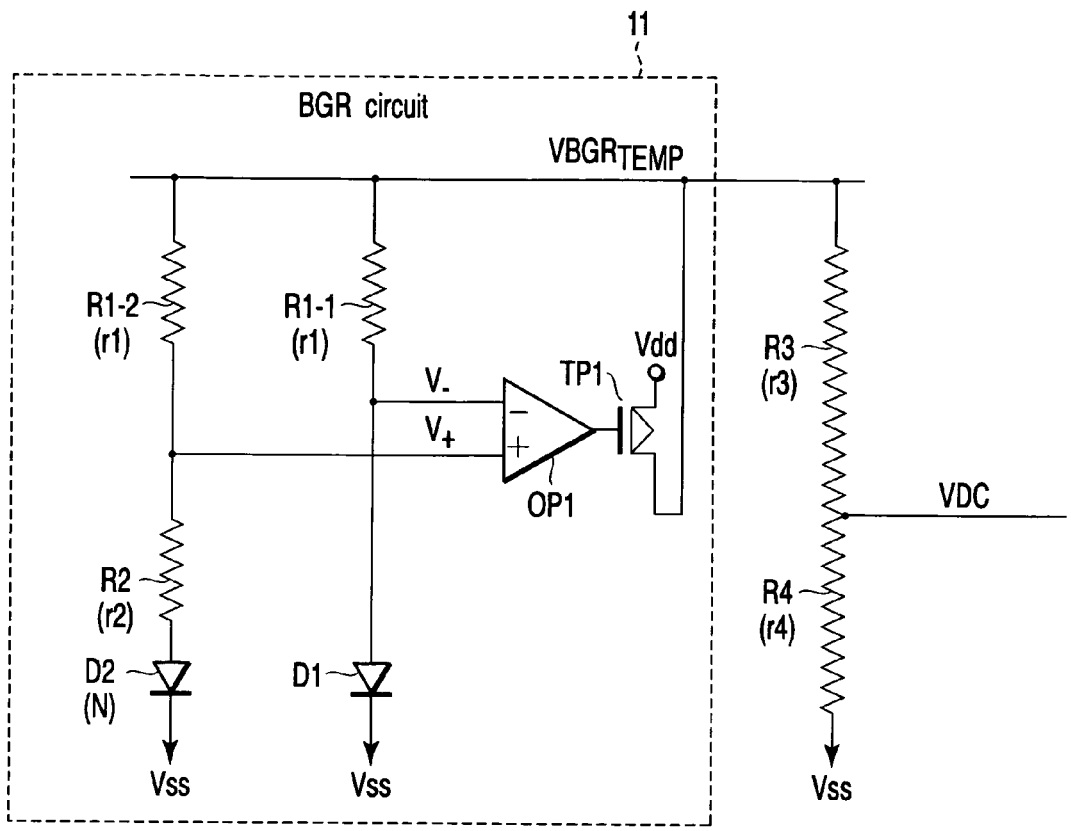
FIG. 8 is a circuit diagram showing a potential generator circuit according to a first embodiment of the present invention.

FIG. 8 is a circuit diagram showing a potential generator circuit according to a first embodiment of the present invention.

The potential generator circuit is composed of a BGR circuit 11, resistors R3 and R4. The BGR circuit 11 outputs a potential VBGRTEMP having temperature dependency. The resistors R3 and R4 are series-connected between an output terminal of the BGR circuit 11 and a ground point Vss.

A dummy capacitor drive potential VDC for generating a sense amplifier reference potential having temperature dependency is output from a connection point between resistors R3 (resistance value r3) and R4 (resistance value r4).

The BGR circuit 11 has first and second current paths. The first current path is connected between the output terminal and the ground point Vss, and composed of diode D2 (N diodes), resistors R1-2 and R2, which are mutually connected in series. The second current path is connected between the output terminal and the ground point Vss, and composed of diode D1 and resistor R1-1, which are mutually connected in series.

The diode D2 is composed of N diodes (N is plural) connected in parallel; on the other hand the diode D1 is composed of one diode. The area of the diode D2 is equal to that of the diode D1.

Resistors R1-1 and R1-2 have resistance value r1, and resistors R2, R3 and R4 have resistance values r2, r3 and r4, respectively.

The BGR circuit 11 further includes an operational amplifier OP1 and a P-channel MOS transistor TP1. A positive input terminal of the operational amplifier OP1 is connected to a connection point between resistors R1-2 and R2. A negative input terminal of the operational amplifier OP1 is connected to a connection point between the diode D1 and the resistor R1-1. The MOS transistor TP1 has a gate connected to an output terminal of the operational amplifier OP1, a source connected to a power supply terminal Vdd, and a drain connected to an output terminal.

In the foregoing potential generator circuit, VBGRTEMP and VDC are expressed as follows.

$$VBGRTEMP = V- + r1/r2 \times \ln N \times k/q \times T$$

$$VDC = VBGRTEMP \times r4/(r3+r4)$$

Where,

V− is a potential of negative input terminal of the operational amplifier OP1, ln is a natural logarithm, N is the number of diodes D2 connected in parallel, k is Boltzmann constant, q is a charge per electron, and T is absolute temperature.

Thus, when VDC=A+B×T is given, A and B are expressed by the following equations.

$$A = V- (@0K) \times r3/(r3+r4)$$

$$B = (r1/r2 \times \ln N \times k/q - 2 \times 10-3) \times r3/(r3+r4)$$

Where, V− (@0K) means V− at absolute zero.

Figure 9:
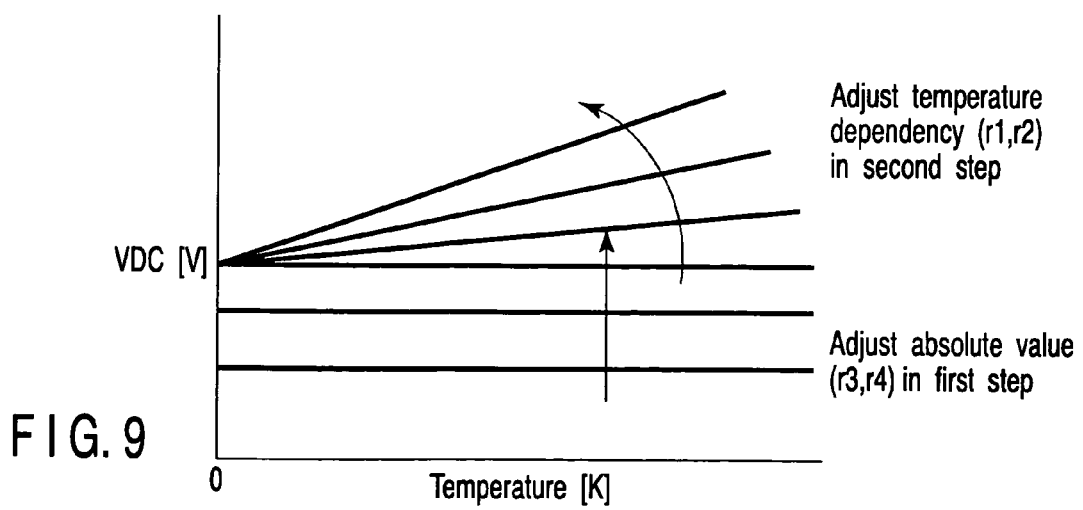
FIG. 9 is a graph to explain the method of setting a VDC in the circuit shown in FIG. 8.

FIG. 9 shows the method of setting the optimum temperature dependency according to the present invention. In the first step, the resistance ratio r3:r4 of resistors R3 to R4 is adjusted, and thereby, the absolute value is adjusted. Thereafter, in the second step, the resistance ratio r1:r2 of resistors R1-1, R1-2 to R2 is adjusted, and thereby, temperature dependency (i.e., gradient of straight line) is adjusted.

(2) Second Embodiment

Figure 10:
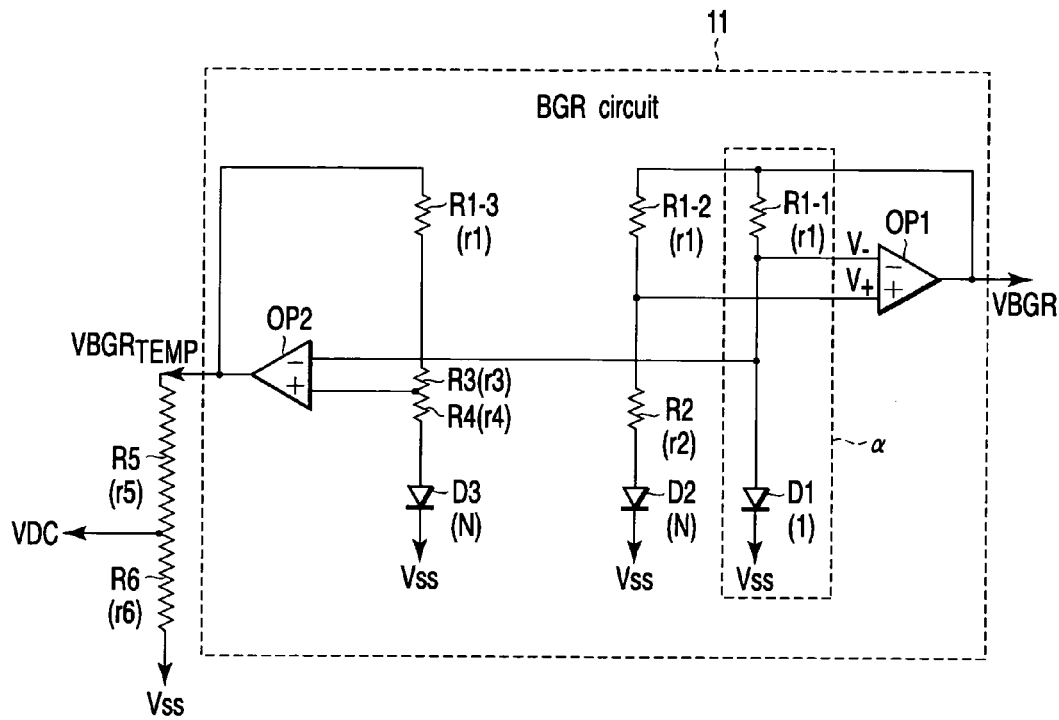
FIG. 10 is a circuit diagram showing a potential generator circuit according to a second embodiment of the present invention.

FIG. 10 is a circuit diagram showing a potential generator circuit according to a second embodiment of the present invention.

The second embodiment differs from the first embodiment in achieving low current consumption and high integration level in the following manner. More specifically, one of two current paths required for generating VBGRTEMP is used in common with one of two current paths required for generating VBGR having no temperature dependency. By doing so, the total number of current paths is reduced; therefore, low current consumption and high integration level are achieved.

The potential generator circuit is composed of a BGR circuit 11, resistors R5 and R6.

The BGR circuit 11 outputs a potential VBGRTEMP having temperature dependency and a potential VBGR having no temperature dependency. The resistors R5 and R6 are connected between a VBGRTEMP output terminal of the BGR circuit 11 and a ground point Vss, and connected in series.

A dummy capacitor drive potential VDC for generating a sense amplifier reference potential having temperature dependency is output from a connection point between resistors R5 (resistance value r5) and R6 (resistance value r6).

The BGR circuit 11 has a first circuit for generating the potential VBGR and a second circuit for generating the potential VBGRTEMP.

The first circuit has first and second current paths. The first current path is composed of a diode D1 and a resistor R1-1, which are series-connected between a VBGR output terminal and a ground point Vss. The second current path is composed of diode D2, resistors R1-2 and R2, which are series-connected between the VBGR output terminal and a ground point Vss. In this case, the diode D2 is composed of N diodes connected in parallel.

Resistors R1-1 and R1-2 have resistance value r1, and the resistor R2 has resistance value r2.

The first circuit further includes an operational amplifier OP1. A positive input terminal of the operational amplifier OP1 is connected to a connection point between resistors R1-2 and R2. A negative input terminal of the operational amplifier OP1 is connected to a connection point between the diode D1 and the resistor R1-1. The potential VBGR is output from an output terminal of the operational amplifier OP1.

The second circuit has first and second current paths. The first current path is composed of a diode D1 and a resistor R1-1, which are series-connected between the VBGR output terminal and the ground point Vss. The second current path is composed of diode D3, resistors R1-3, R3 and R4, which are series-connected between the VBGRTEMP output terminal and a ground point Vss. In this case, the diode D3 is composed of N diodes connected in parallel.

Resistors R1-1 and R1-3 have resistance value r1, and resistors R3 and R4 have resistance value r3 and r4, respectively.

The first current path α is used in common between the first and second circuits, so that the total number of current paths can be reduced; therefore, low current consumption is achieved.

The second circuit further includes an operational amplifier OP2. A positive input terminal of the operational amplifier OP2 is connected to a connection point between resistors R3 and R4. A negative input terminal of the operational amplifier OP2 is connected to a connection point between the diode D1 and the resistor R1-1. The potential VBGRTEMP is output from an output terminal of the operational amplifier OP2.

Figure 11:
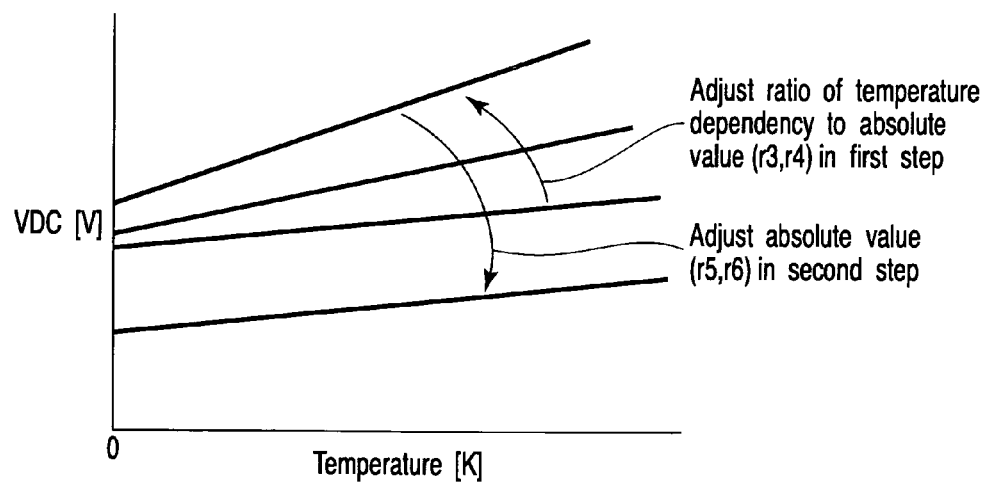
FIG. 11 is a graph to explain the method of setting a VDC in the circuit shown in FIG. 10.

FIG. 11 shows the method of setting the optimum temperature dependency according to the present invention. In the first step, the resistance ratio r3:r4 of resistors R3 to R4 is adjusted, and thereby, the ratio of temperature dependency to absolute value is adjusted. Thereafter, in the second step, the resistance ratio r5:r6 of resistors R5 to R6 is adjusted, and thereby, the absolute value is adjusted.

(3) Third Embodiment

Figure 12:
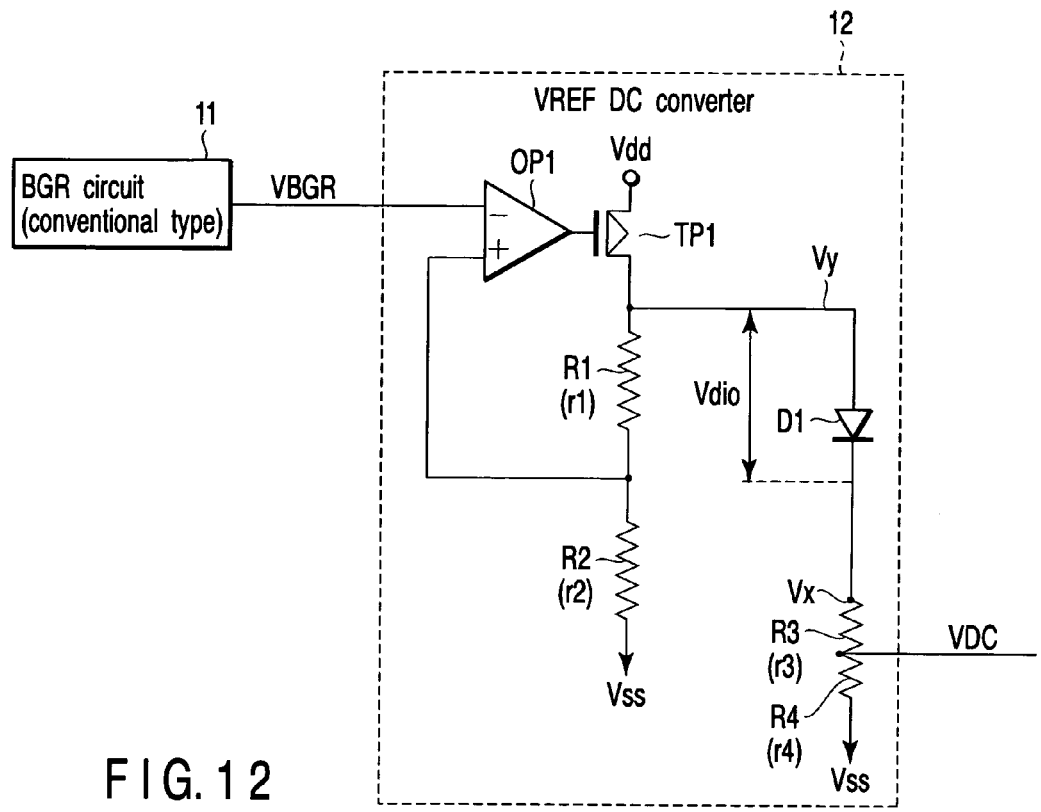
FIG. 12 is a circuit diagram showing a potential generator circuit according to a third embodiment of the present invention.

FIG. 12 is a circuit diagram showing a potential generator circuit according to a third embodiment of the present invention.

According to the third embodiment, a constant potential VBGR having no temperature dependency is generated using a conventional type BGR circuit 11. Based on the potential VBGR, a VDC converter 12 generates a dummy capacitor drive potential VDC having temperature dependency.

The VDC converter 12 will be explained below.

P-channel MOS transistor TP1, resistor R1 (resistance value r1) and resistor R2 (resistance value r2) are series-connected between a power supply terminal Vdd and a ground point Vss. A negative input terminal of an operational amplifier OP1 is supplied with VBGR while a positive input terminal thereof is connected with a connection point of resistors R1 and R2.

Diode D1, resistor R3 (resistance value r3) and resistor R4 (resistance value r4) are series-connected between a drain of the MOS transistor TP1 and a ground point Vss. The potential VDC is output from a connection point of resistors R3 and R4.

Here, there has been known that voltage Vdio generated both terminals of the diode D1 has temperature dependency of about −2 [mV/K].

Thus, resistance values r1 to r4 are adjusted, and thereby, VDC having temperature dependency is output from the connection point of resistors R3 and R4.

In the converter circuit, Vx, Vy and VDC are expressed as follows.

$$Vy = VBGR \times (r1+r2)/r2$$

$$Vx = Vy - Vdio(@0K) + (2 \times 10-3) \times T$$

$$VDC = Vx \times r4/(r3+r4)$$

Where, Vdio (@0K) means Vdio at absolute zero.

Thus, when VDC=A+B×T is given, A and B are expressed by the following equations.

$$A = \{VBGR \times (r1+r2)/r2 - Vdio(@0K)\} \times r4/(r3+r4)$$

$$B = (2 \times 10-3) \times r4/(r3+r4)$$

Figure 13:
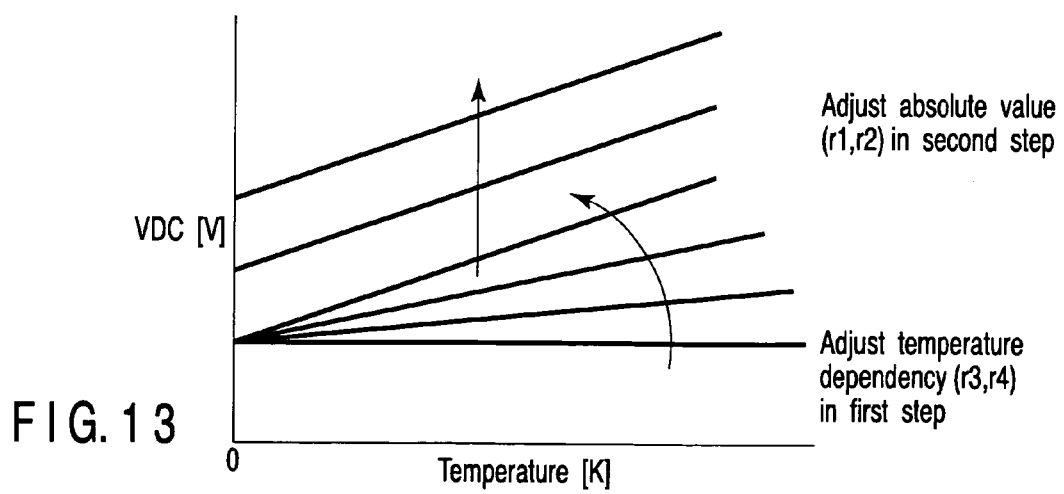
FIG. 13 is a graph to explain the method of setting a VDC in the circuit shown in FIG. 12.

FIG. 13 shows the method of setting the optimum temperature dependency according to the present invention. In the first step, the resistance ratio r3:r4 of resistors R3 to R4 is adjusted, and thereby, temperature dependency (i.e., gradient of straight line) is adjusted. Thereafter, in the second step, the resistance ratio r1:r2 of resistors R1 to R2 is adjusted, and thereby, the absolute value is adjusted.

(4) Fourth Embodiment

Figure 14:
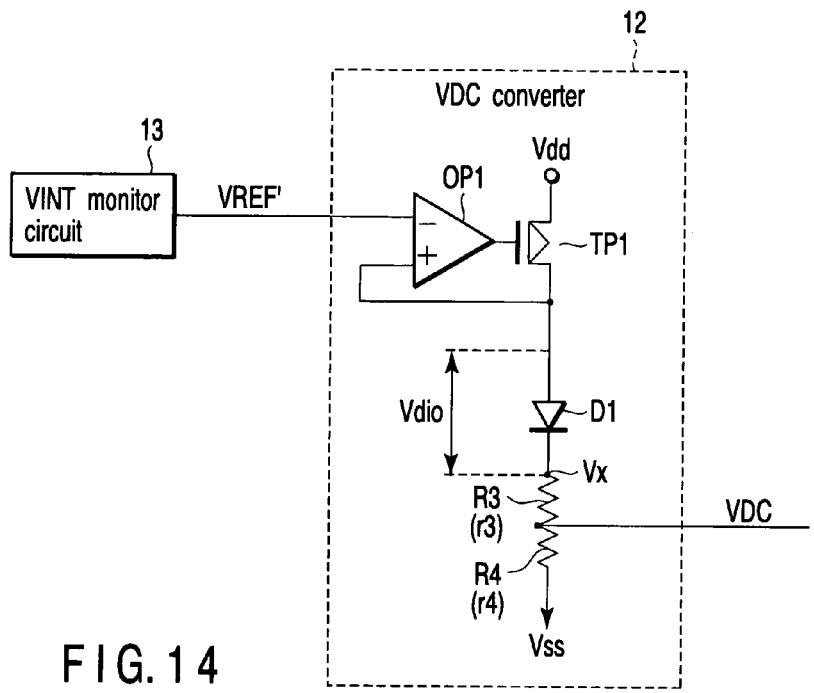
FIG. 14 is a circuit diagram showing a potential generator circuit according to a fourth embodiment of the present invention.

FIG. 14 is a circuit diagram showing a potential generator circuit according to a fourth embodiment of the present invention.

The concept of the fourth embodiment is basically the same as the third embodiment. More specifically, a potential stepped-up for peripheral circuits is generated based on the constant potential VBGR having no temperature dependency, which generated by the conventional type BGR circuit. The potential is given to a current path comprising diode and resistor connected in series, and thereby, current is carried. Thereafter, a potential having temperature dependency is extracted at a proper point.

According to the fourth embodiment, a VDC converter 12 generates a dummy capacitor drive potential VDC having temperature dependency based on a reference potential VREF'. The reference potential VREF' is output from a potential monitor (VINT monitor circuit) 13 of a step-up potential generator circuit for peripheral circuits. By doing so, the one current path is reduced it is number; therefore, this contributes to low current consumption.

The VDC converter 12 will be explained below.

P-channel MOS transistor TP1, diode D1, resistor R3 (resistance value r3) and resistor R4 (resistance value r4) are series-connected between a power supply terminal Vdd and a ground point Vss. A negative input terminal of an operational amplifier OP1 is supplied with an output signal VREF' of the VINT monitor circuit 13 while a positive input terminal thereof is connected with a drain of the MOS transistor TP1. An output terminal of the operational amplifier OP1 is connected with a gate of the MOS transistor TP1. The potential VDC is output from a connection point of resistors R3 and R4.

Here, there has been known that voltage Vdio generated both terminals of the diode D1 has temperature dependency of about −2 [mV/K].

Thus, resistance values r3 and r4 are adjusted, and thereby, a potential VDC having temperature dependency is output from the connection point of resistors R3 and R4.

In the converter circuit, Vx and VDC are expressed as follows.

$$Vx = VREF' - Vdio(@0K) + (2 \times 10-3) \times T$$

$$VDC = Vx \times r4/(r3+r4)$$

Thus, when VDC=A+B×T is given, A and B are expressed by the following equations.

$$A = \{VREF' - Vdio(@0K)\} \times r4/(r3+r4)$$

$$B = (2 \times 10-3) \times r4/(r3+r4)$$

Figure 15:
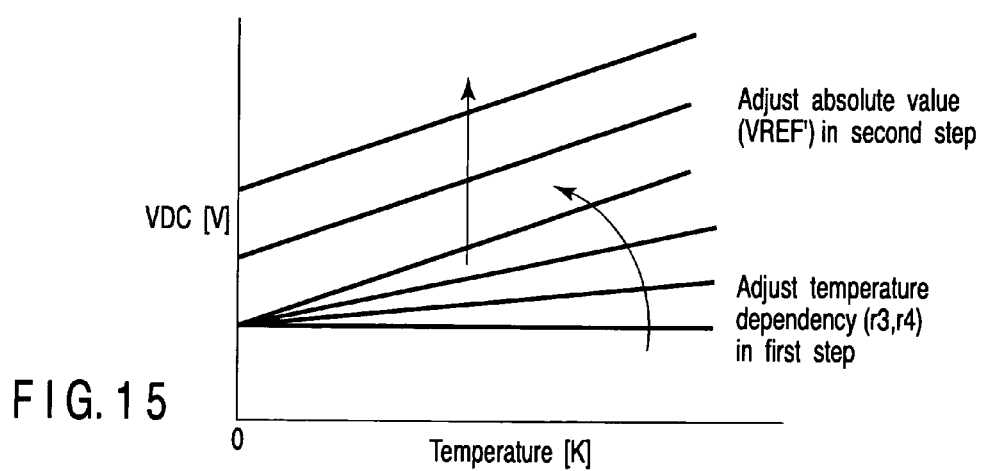
FIG. 15 is a graph to explain the method of setting a VDC in the circuit shown in FIG. 14.
Figure 16:
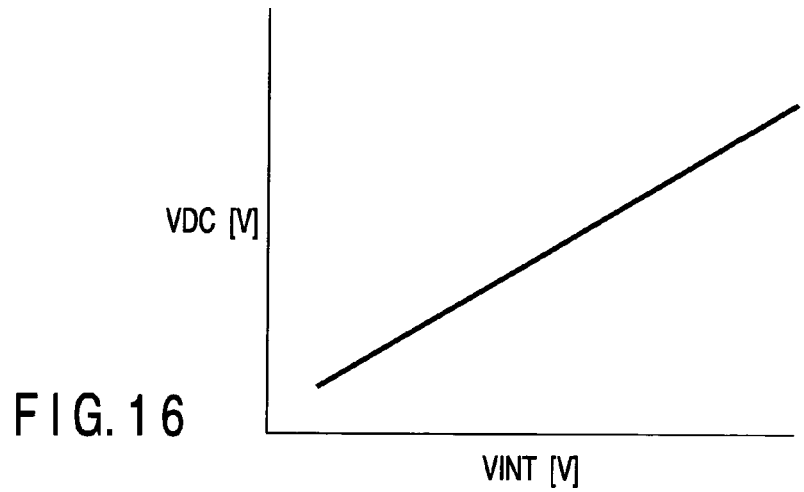
FIG. 16 is a graph to explain the relationship between VSA and VDC.

FIG. 15 shows the method of setting the optimum temperature dependency according to the present invention. In the first step, the resistance ratio r3:r4 of resistors R3 to R4 is adjusted, and thereby, temperature dependency (i.e., gradient of straight line) is adjusted. Thereafter, in the second step, the potential VREF' is adjusted, and then, the absolute value is adjusted.

(5) Fifth Embodiment

Figure 17:
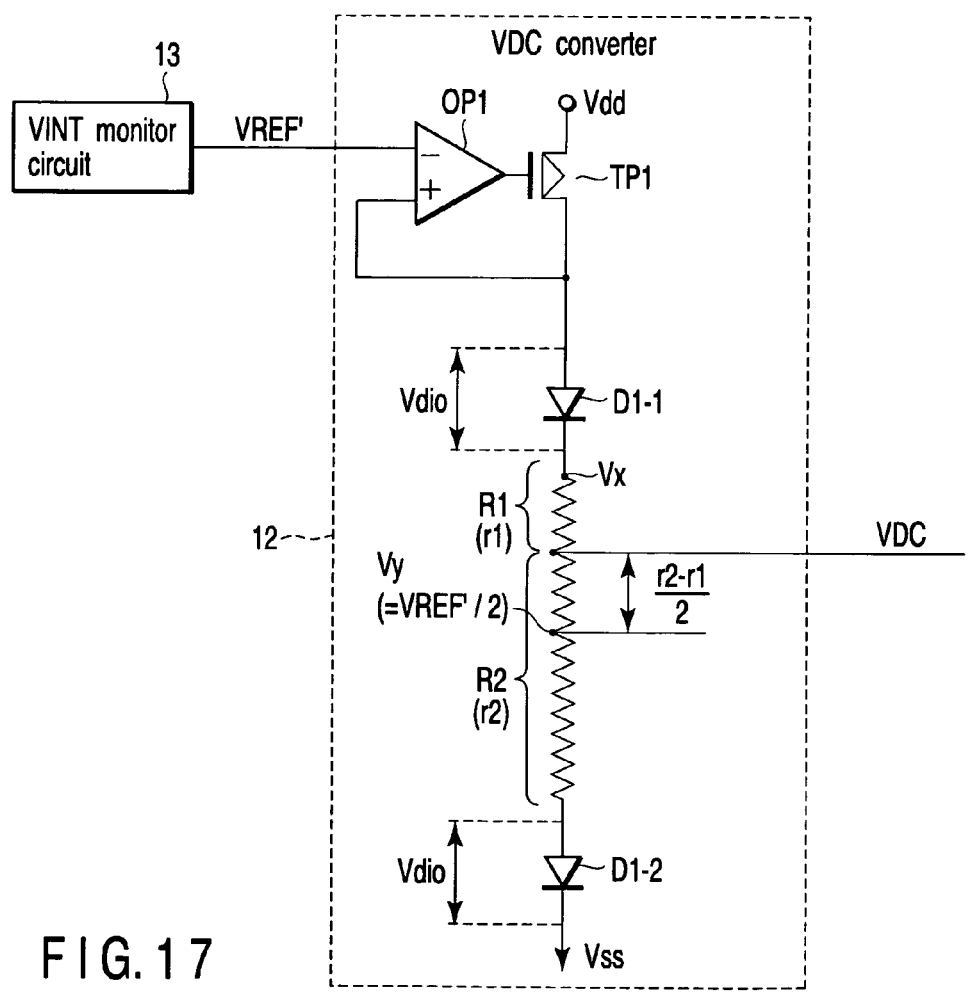
FIG. 17 is a circuit diagram showing a potential generator circuit according to a fifth embodiment of the present invention.

FIG. 17 is a circuit diagram showing a potential generator circuit according to a fifth embodiment of the present invention.

The fifth embodiment relates to a modification example of the fourth embodiment. According to the fifth embodiment, a VINT monitor circuit 13 generates a reference potential VREF' based on a constant potential VBGR having no temperature dependency, which is generated by a conventional type BGR circuit. The reference potential VREF' is given to a current path comprising diodes D1-1, D1-2, thereby generating a dummy capacitor drive potential VDC having temperature dependency.

A VDC converter 12 will be explained below.

P-channel MOS transistor TP1, diodes D1-1, D1-2 resistor R1 (resistance value r1) and resistor R2 (resistance value r2) are series-connected between a power supply terminal Vdd and a ground point Vss. A negative input terminal of an operational amplifier OP1 is supplied with an output signal VREF' of the VINT monitor circuit 13 while a positive input terminal thereof is connected with a drain of the MOS transistor TP1. An output terminal of the operational amplifier OP1 is connected with a gate of the MOS transistor TP1. The potential VDC is output from a connection point of resistors R1 and R2.

Here, there has been known that voltage Vdio generated both terminals of the diodes D1-1 and D1-2 has temperature dependency of about −2 [mV/K].

Thus, resistance values r1 and r2 are adjusted, and thereby, a potential VDC having temperature dependency is output from the connection point of resistors R1 and R2.

In the converter circuit, Vx, Vy and VDC are expressed as follows.

$$Vx=VREF'-Vdio(@0K)+(2\times10-3)\times T$$

$$Vy=VREF'/2$$

$$VDC=Vy+(Vx-Vy)\times(r2-r1)/(r1+r2)$$

Thus, when VDC=A+B×T is given, A and B are expressed by the following equations.

$$A=VREF'/2+\{VREF'/2-Vdio(@0K)\}\times(r2-r1)/(r1+r2)$$

$$B=(2\times10-3)\times(r2-r1)/(r1+r2)$$

Figure 18:
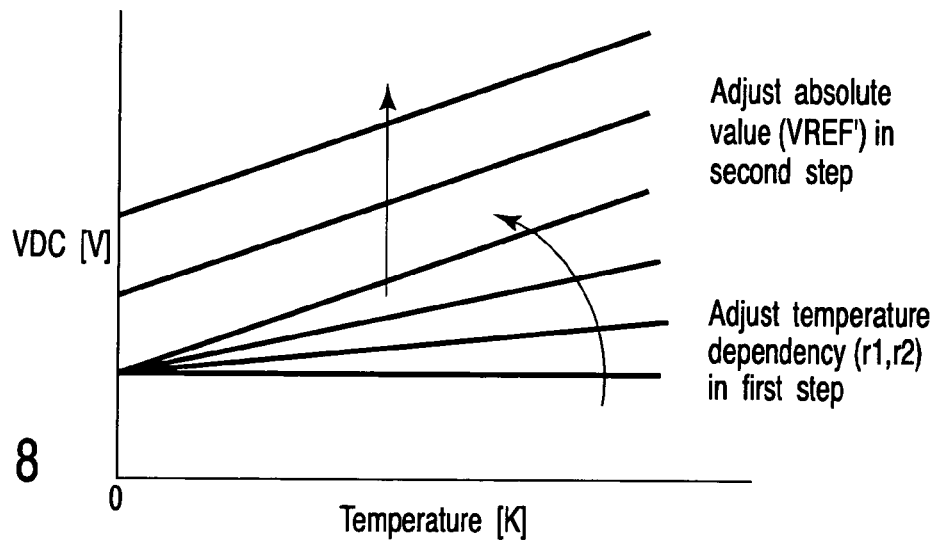
FIG. 18 is a graph to explain the method of setting a VDC in the circuit shown in FIG. 17.

FIG. 18 shows the method of setting the optimum temperature dependency according to the present invention. In the first step, the resistance ratio r1:r2 of resistors R1 to R2 is adjusted, and thereby, temperature dependency (i.e., gradient of straight line) is adjusted. Thereafter, in the second step, the potential VREF' is adjusted, and then, the absolute value is adjusted.

(6) Sixth Embodiment

Figure 19:
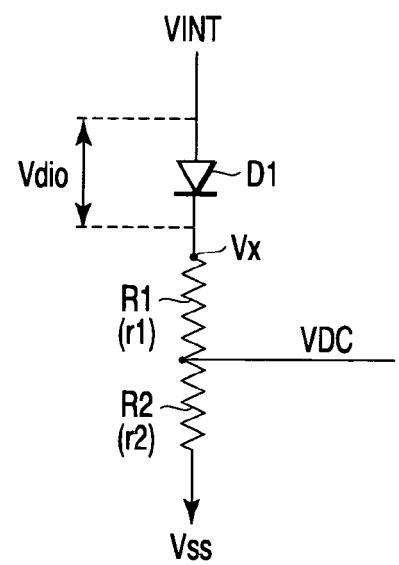
FIG. 19 is a circuit diagram showing a potential generator circuit according to a sixth embodiment of the present invention.

FIG. 19 is a circuit diagram showing a potential generator circuit according to a sixth embodiment of the present invention.

According to the sixth embodiment, a dummy capacitor drive potential VDC having temperature dependency is generated using internal power supply potential VINT supplied to peripheral circuits. (The potential VINT is kept constant with respect to an external power supply potential and a change of temperature). By doing so, this largely contributes to reduction of current consumption and circuit area.

A current path is composed of diode D1, resistors R1 and R2, which are connected in series. The dummy capacitor drive potential VDC is output from a connection point of the resistor R1 (resistance value r1) and the resistor R2 (resistance value r2).

The potential VDC is expressed as follows.

$$VDC=\{VINT-Vdio(@0K)\}\times r2/(r1+r2)+(2\times10-3)\times r2/(r1+r2)$$

In this case, the temperature dependency is adjusted in the following manner. In the first step, the resistance ratio r1:r2 of resistors R1 to R2 is adjusted, and thereby, temperature dependency is adjusted. Thereafter, in the second step, the internal power supply potential VINT is adjusted, and then, the absolute value is adjusted.

In the sixth embodiment, the dummy capacitor drive potential VDC changes depending on the internal power supply potential VINT, (which is kept constant as described above). Thus, it is impossible to change the internal power supply potential VINT independently from the dummy capacitor drive potential VDC.

(7) Seventh Embodiment

FIG. 20 is a circuit diagram showing a potential generator circuit according to a seventh embodiment of the present invention.

According to the seventh embodiment, a dummy capacitor drive potential VDC is generated using an internal power supply potential VINT supplied to peripheral circuits. (The internal power supply potential VINT is kept constant with respect to an external power supply potential and a change of temperature.)

A first current path is composed of diodes D1-1, D1-2, resistors R1 and R2, which are connected in series. A potential VDC' is output from a connection point of the resistor R1 (resistance value r1) and the resistor R2 (resistance value r2).

A second current path is composed of P-channel MOS transistor TP1, resistors R3 and R4, which are connected in series. A dummy capacitor drive potential VDC is output from a connection point of the resistor R3 (resistance value r3) and the resistor R4 (resistance value r4).

A negative input terminal of an operational amplifier OP1 is supplied with the potential VDC' while a positive input terminal thereof is connected with a drain of the MOS transistor TP1. An output terminal of the operational amplifier OP1 is connected with a gate of the MOS transistor TP1.

In the converter circuit, Vx, Vy, VDC' and VDC are expressed as follows.

$$Vx=VINT-Vdio(@0K)+(2\times10-3)\times T$$

$$Vy=VINT/2$$

$$VDC'=Vy+(Vx-Vy)\times(r2-r1)/(r1+r2)$$

Thus, when VDC'=A+B×T is given, A and B are expressed by the following equations.

$$A=VINT/2+\{VINT/2-Vdio(@0K)\}\times(r2-r1)/(r1+r2)$$

$$B=(2\times10-3)\times(r2-r1)/(r1+r2)$$

$$VDC=r4/(r3+r4)\times VDC'$$

The method of setting the optimum temperature dependency according to the present invention is carried out in the following manner. In the first step, the resistance ratio r1:r2 of resistors R1 to R2 is adjusted, and thereby, absolute value and temperature dependency are adjusted. Thereafter, in the second step, the resistance ratio r3:r4 of resistors R3 to R4 is adjusted, and thereby, the potential VDC is generated.

(8) Eighth Embodiment

FIG. 21 is a circuit diagram showing a potential generator circuit according to an eighth embodiment of the present invention.

The eighth embodiment relates to a modification example of the seventh embodiment. According to the eighth embodiment, a dummy capacitor drive potential VDC is generated using an internal power supply potential VINT supplied to peripheral circuits. In this case, the internal power supply potential VINT is kept constant with respect to an external power supply potential and a change of temperature. The eighth embodiment has features of trimming the ratio of absolute value to temperature dependency in a wide range.

In the converter circuit, Vx, Vy, VDC' and VDC are expressed as follows.

$$Vx = VINT - Vdio(@0K) \times 2 + (4 \times 10-3) \times T$$

$$Vy = VINT/3$$

$$VDC' = Vy + (Vx - Vy) \times (2 \times r2 - r1)/2 \times (r1 + r2)$$

Thus, when VDC'=A+B×T is given, A and B are expressed by the following equations.

$$A = VINT/3 + \{VINT \times 2/3 - Vdio(@0K) \times 2\} \times (2 \times r2 - r1)/2 \times (r1 + r2)$$

$$B = (4 \times 10-3) \times (2 \times r2 - r1)/2 \times (r1 + r2)$$

The method of setting the optimum temperature dependency according to the present invention is carried out in the following manner. In the first step, the resistance ratio r1:r2 of resistors R1 to R2 is adjusted, and thereby, absolute value and temperature dependency are adjusted. Thereafter, in the second step, the resistance ratio r3:r4 of resistors R3 to R4 is adjusted, and thereby, the potential VDC is generated.

In the eighth embodiment, the temperature dependency of the potential VDC is adjusted to the experimental value, and the VDC has a positive correlation with VINT.

(9) Ninth Embodiment

Figure 22:
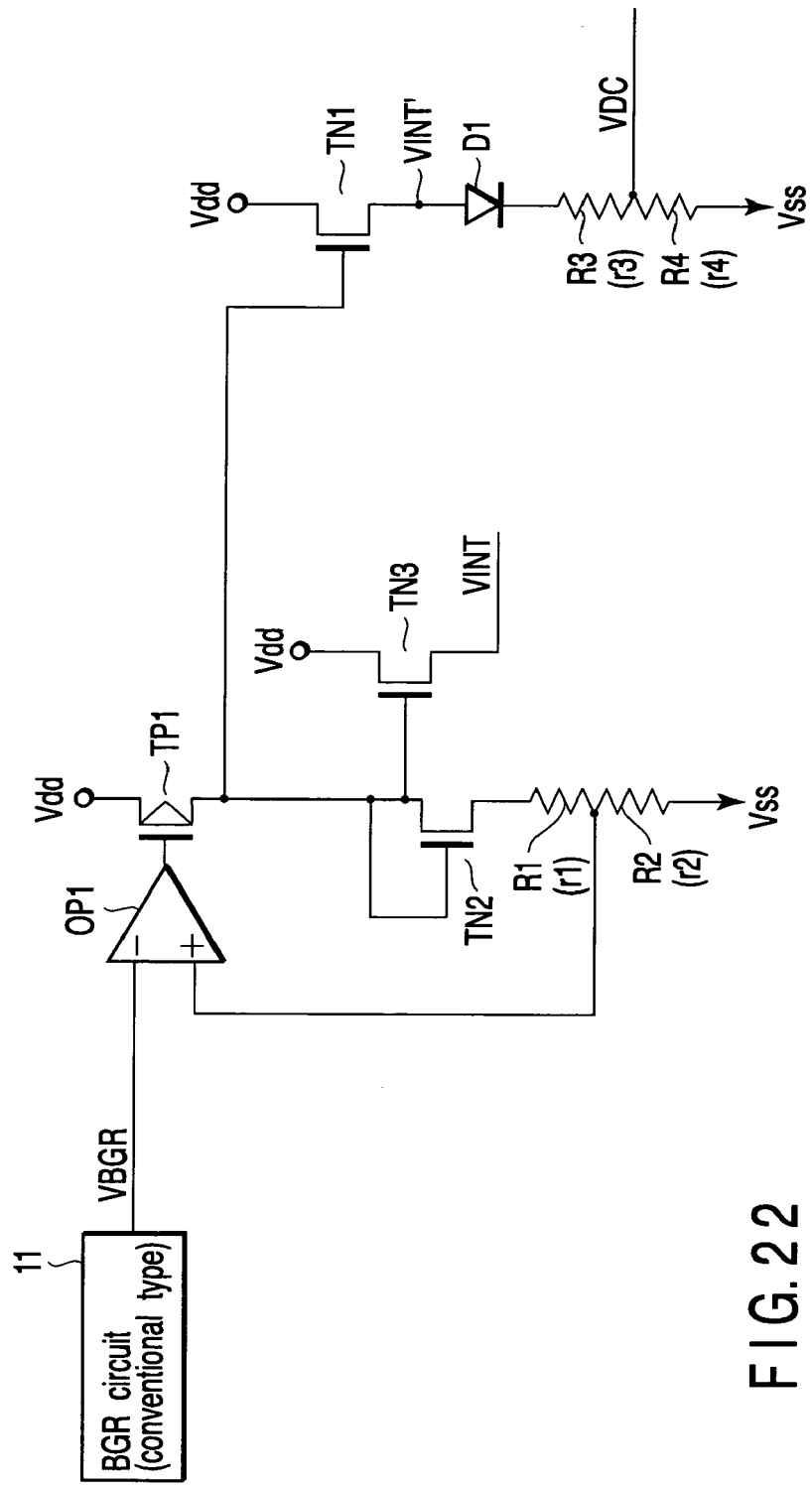
FIG. 22 is a circuit diagram showing a potential generator circuit according to a ninth embodiment of the present invention.

FIG. 22 is a circuit diagram showing a potential generator circuit according to a ninth embodiment of the present invention.

A conventional type BGR circuit 11 outputs an output potential VBGR having no temperature dependency. A first current path is composed of P-channel MOS transistor TP1, N-channel transistor TN2, resistors R1 and R2. A negative input terminal of an operational amplifier OP1 is supplied with VBGR while a positive input terminal thereof is connected with a connection point of the resistor R1 (resistance value r1) and the resistor R2 (resistance value r2).

The drain of the MOS transistor TP1 is connected with the gate of a N-channel MOS transistor TN3. An internal power supply potential VINT, (which is kept constant with respect to an external power supply potential and a change of temperature) is output from the source of the MOS transistor TN3.

On the other hand, a second current path is composed of N-channel MOS transistor TN1, diode D1, resistors R3 and R4. A dummy capacitor drive potential VDC is output from a connection point of the resistor R3 (resistance value r3) and the resistor R4 (resistance value r4).

In the second current path, a potential of a connection node of the MOS transistor TN1 and the diode D1 becomes equal to the internal power supply potential VINT output from the source of the MOS transistor TN3. (The potential VINT is kept constant as described above.)

Thus, in the circuit, VDC is expressed as follows.

$$VDC = \{VINT - Vdio(@0K)\} \times r4/(r3+r4) + (2 \times 10-3) \times r4/(r3+r4)$$

The circuit of the ninth embodiment can achieve low current consumption and reduction of circuit area. In addition, the threshold value of the MOS transistor TN1 is variable in accordance with variations of the threshold value of the MOS transistor TN3. Therefore, a potential VINT' supplied by the MOS transistor TN1 is variable in accordance with variations of the internal power supply potential VINT outputted by the MOS transistor TN3. (The potential VINT is kept constant as described above.)

(10) Tenth Embodiment

Figure 23:
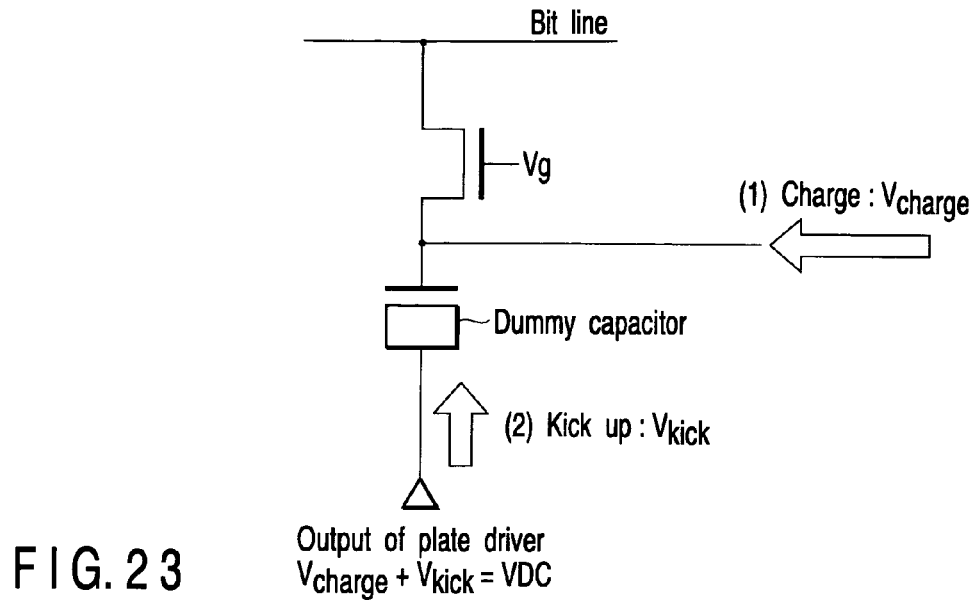
FIG. 23 is a view to explain the method of generating a reference potential given to a bit line.
Figure 24:
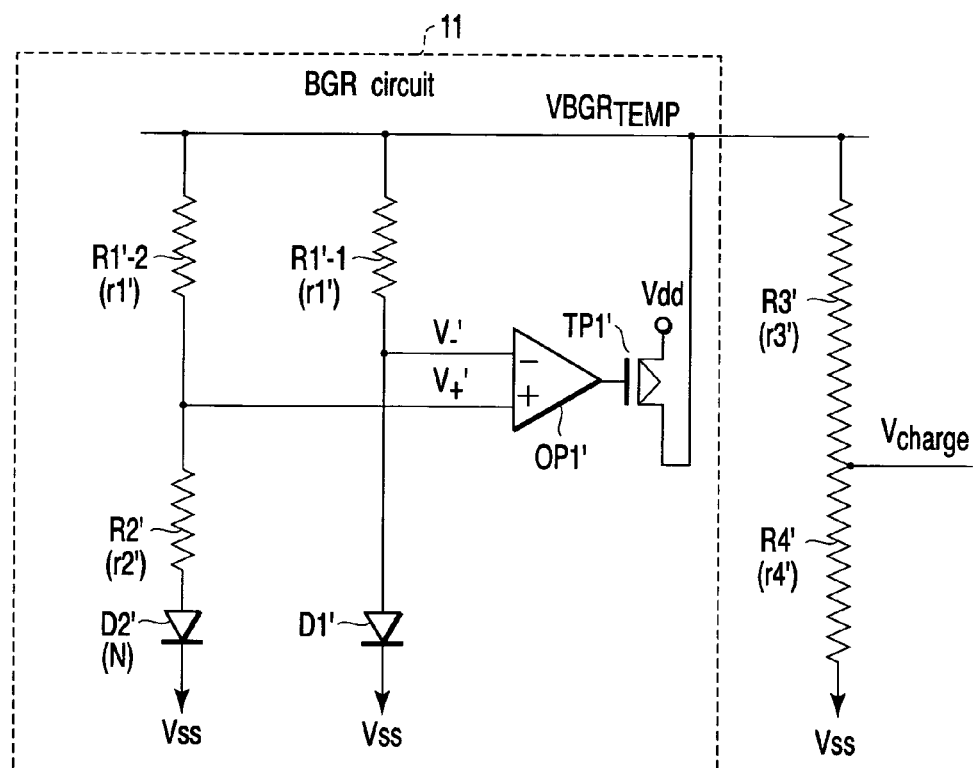
FIG. 24 is a circuit diagram showing a potential generator circuit according to a tenth embodiment of the present invention.

FIG. 23 to FIG. 25 show a potential generator circuit according to a tenth embodiment of the present invention.

The tenth embodiment relates to a circuit for outputting several kinds of potentials, for example, a potential Vcharge having temperature dependency and a potential Vkick having no temperature dependency.

A reference potential given to a bit line is generated in the following manner. As shown in FIG. 23, a potential Vcharge is pre-charged to one electrode (gate of MOS capacitor) of a dummy capacitor. Thereafter, a potential Vkick is given to the other electrode (source/drain of MOS capacitor and substrate) of the dummy capacitor.

Considering the foregoing matter, temperature dependency is given to the potential Vcharge supplied to one electrode of the dummy capacitor potential. On the other hand, the temperature dependency is not given to the potential Vkick supplied to the other electrode of the dummy capacitor. By doing so, the temperature dependency and the absolute value are independently controlled with respect to the reference potential given to the bit line.

In this case, a circuit (same as the circuit of the first embodiment) shown in FIG. 24 generates the potential Vcharge having temperature dependency. On the other hand, a circuit shown in FIG. 25 generates the potential Vkick having no temperature dependency.

Thus, VBGRTEMP, VBGR, Vkick and Vcharge are expressed as follows.

$$VBGRTEMP = V-' + r1'/r2' \times \ln N \times k/q \times T$$

$$VBGR \approx 1.25$$

$$Vkick = VBGR \times r4/(r3+r4)$$

$$Vcharge = VBGRTEMP \times r4'/(r3'+r4')$$

where,

V−' is a potential of the negative input terminal of an operational amplifier OP1', r1 is each resistance value of resistors R1'-1 and R1'-2, r2', r3' and r4' are resistance values of resistors R2', R3' and R4', respectively, ln is a natural logarithm, N is the number of diodes D2, k is Boltzmann constant, q is a charge per electron, T is absolute temperature, and r3 and r4 are each resistance value of resistors R3 and R4

The method of setting the optimum temperature dependency is carried out in the following manner. In the first step, the resistance ratio r1':r2' of resistors R1' to R2' is adjusted, and thereby, temperature dependency are adjusted. Thereafter, in the second step, the resistance ratio r3':r4' of resistors R3' to R4' is adjusted, and thereby, the absolute value is adjusted.

4. Others

According to the present invention, there is provided a semiconductor memory, which can give temperature dependency to a sense amplifier reference potential, and independently control the temperature dependency and the absolute value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory comprising:
   a circuit for reading a data from a memory cell to one of a complementary bit line pair, and giving a reference potential for determining a value of the data to the other thereof; and
   a potential generator circuit for giving temperature dependency to the reference potential based on a potential having temperature dependency,
   the potential generator circuit independently controlling an absolute value and the temperature dependency of the reference potential.

2. The memory according to claim 1, wherein the reference potential increases proportional to a rise of temperature.

3. The memory according to claim 1, wherein when a temperature range is A[K]<T<B[K] (A and B are arbitrary numbers, T is temperature, K is absolute temperature), the reference potential is variable on a straight line connecting an intermediate value of the minimum value of "1" read potential distribution and the maximum value of "0" read potential distribution in temperature A[K], and an intermediate value of the minimum value of the "1" read potential distribution and the maximum value of the "0" read potential distribution in temperature B[K].

4. The memory according to claim 1, wherein the reference potential increases with a rise of temperature in a range lower than temperature C[K] (C is an arbitrary number and K is absolute temperature) while decreasing with a rise of temperature in a range higher than the temperature C[K].

5. The memory according to claim 1, wherein when a temperature range is A[K]<T<B[K] (A and B are arbitrary numbers, T is temperature, K is absolute temperature), the reference potential is variable on the following first and second straight lines:
   the first straight line connecting an intermediate value of the minimum value of "1" read potential distribution and the maximum value of "0" read potential distribution in temperature A[K], and an intermediate value of the minimum value of the "1" read potential distribution and the maximum value of the "0" read potential distribution in temperature C[K](A<B<C);
   the second straight line connecting an intermediate value of the minimum value of "1" read potential distribution and the maximum value of "0" read potential distribution in temperature C[K], and an intermediate value of the minimum value of the "1" read potential distribution and the maximum value of the "0" read potential distribution in temperature B[K].

6. The memory according to claim 3, wherein the straight line is expressed by the following equation $VDC = y \times (\alpha + \beta \times T)$ where, y, $\alpha$ and $\beta$ are each constant, and VDC is equivalent to an output potential.

7. The memory according to claim 1, wherein the potential generator circuit includes:
   a BGR circuit for outputting a potential having temperature dependency; and
   first and second resistors series-connected between an output terminal of the BGR circuit and a ground point, an output potential is output from a connection point of the first and second resistors.

8. The memory according to claim 7, wherein the BGR circuit includes:
   a first current path composed of first diode, third and fourth resistors, which are series-connected between the output terminal and the ground point;
   a second current path composed of a second diode and a fifth resistor, which are series-connected between the output terminal and the ground point;
   an operational amplifier having a first input terminal connected to a connection point of the third and fourth resistors, and a second input terminal connected to a connection point of the second diode and the fifth resistor; and
   a MOS transistor having a gate connected to an output terminal of the operational amplifier, a source connected to a power supply terminal, and a drain connected to the output terminal thereof.

9. The memory according to claim 1, wherein the potential generator circuit includes:
   a BGR circuit having a first output terminal for outputting a potential having temperature dependency, and a second output terminal for outputting a potential having no temperature dependency; and
   first and second resistors series-connected between the first output terminal and a ground point,
   an output potential is output from a connection point of the first and second resistors.

10. The memory according to claim 9, wherein the BGR circuit includes:
    a first current path composed of first diode, third and fourth resistors, which are series-connected between the first output terminal and the ground point;
    a second current path composed of a second diode and a fifth resistor, which are series-connected between the second output terminal and the ground point;
    a third current path composed of a third diode, sixth and seventh resistors, which are series-connected between the second output terminal and the ground point;
    a first operational amplifier having a first input terminal connected to a connection point of the third and fourth resistors, a second input terminal connected to a connection point of the second diode and the fifth resistor, and an output terminal connected to the first output terminal; and
    a second operational amplifier having a first input terminal connected to a connection point of the sixth and seventh resistors, a second input terminal connected to a connection point of the second diode and the fifth resistor, and an output terminal connected to the second output terminal.

11. The memory according to claim 1, wherein the potential generator circuit includes: a diode having temperature dependency; and first and second resistors series-connected between the diode and a ground point, and carries a current to a current path composed of the diode, the first and second resistors based on a potential having no temperature dependency,
    an output potential is output from a connection point of the first and second resistors.

12. The memory according to claim 1, wherein the potential generator circuit includes:
    a BGR circuit for outputting a potential having no temperature dependency; and
    a converter for outputting an output potential having temperature dependency based on the potential output from the BGR circuit, the converter includes:
a first current path composed of first and second resistors and a MOS transistor, which are series-connected between a power supply terminal and a ground point;
an operational amplifier having a first input terminal connected to a connection point of the first and second resistors, a second input terminal supplied with the potential output from the BGR circuit, and an output terminal connected to a gate of the MOS transistor; and
a second current path composed of a diode, third and fourth resistors, which are series-connected between a drain of the MOS transistor and the ground point,
an output potential is output from a connection point of the third and fourth resistors.

13. The memory according to claim 1, wherein the potential generator circuit includes:
a monitor circuit for outputting a potential having no temperature dependency; and
a converter for outputting an output potential having temperature dependency based on the potential output from the monitor circuit,
the converter comprising:
a diode and a MOS transistor, which are series-connected between a power supply terminal and a first node;
first and second resistors connected between the first node and a ground point; and
an operational amplifier having a first input terminal connected to the first node, a second input terminal supplied with a potential having no temperature dependency, output from the monitor circuit, and an output terminal connected to a gate of the MOS transistor,
an output potential being output from a connection point of the first and second resistors.

14. The memory according to claim 1, wherein the potential generator circuit includes:
a monitor circuit for outputting a potential having no temperature dependency; and
a converter for outputting an output potential having temperature dependency based on the potential output from the monitor circuit,
the converter comprising:
a first current path composed of a first diode and a MOS transistor, which are series-connected between a power supply terminal and a first node;
a second current path composed of a second diode and a MOS transistor, which are series-connected between the first node and a ground point;
an operational amplifier having a first input terminal connected to a drain of the MOS transistor, a second input terminal supplied with the potential output from the monitor circuit, and an output terminal connected to a gate of the MOS transistor,
an output potential being output from a connection point of the first and second resistors.

15. The memory according to claim 1, wherein the potential generator circuit includes:
a diode having an anode supplied with a sense amplifier drive potential, and a cathode connected to one terminal of a first resistor; and
a second resistor connected between the other terminal of the first resistor and a ground point,
an output potential being output from a connection point of the first and second resistors.

16. The memory according to claim 1, wherein the potential generator circuit includes:
a first diode having an anode supplied with a sense amplifier drive potential, and a cathode connected to a first node;
a second diode having an anode connected to a second node, and a cathode connected to a ground point;
first and second resistors connected between the first and second nodes;
a current path composed of a MOS transistor, third and fourth resistors and, which are series-connected between a power supply terminal and a ground point;
an operational amplifier having a first input terminal connected to a drain of the MOS transistor, a second input terminal connected to a connection point of the first and second resistors, and an output terminal connected to a gate of the MOS transistor,
an output potential being output from a connection point of the first and second resistors.

17. The memory according to claim 1, wherein the potential generator circuit includes:
a BGR circuit for outputting a potential having no temperature dependency; and
a converter for outputting an output potential having temperature dependency based on the potential output from the BGR circuit,
the converter includes:
a first current path composed of first and second resistors, first and second MOS transistors, which are series-connected between a power supply terminal and a ground point;
an operational amplifier having a first input terminal connected to a connection point of the first and second resistors, a second input terminal supplied with the potential output from the BGR circuit, and an output terminal connected to a gate of the first MOS transistor; and
a second current path composed of third and fourth resistors, and a third MOS transistor, which are series-connected between the power supply terminal and the ground point;
a fourth MOS transistor having a gate connected to a drain of the first MOS transistor, and a source connected to the power supply terminal, a sense amplifier drive potential being output from the drain,
the second MOS transistor being connected to the diode,
a gate of the third MOS transistor being connected to the drain of the first MOS transistor,
an output potential being output from a connection point of the third and fourth resistors.

18. The memory according to claim 17, wherein the sense amplifier drive potential has a value having temperature dependency, and the drains of the first and third MOS transistors have a potential equal to each other.

19. A semiconductor memory comprising:
a bit line having a reference potential;
a dummy capacitor composed of a MOS transistor;
a first potential generator circuit for charging a gate of the MOS transistor, for generating the reference potential, wherein a gate of the MOS transistor is connected to the bit line; and
a second potential generator circuit for driving source and drain of the MOS transistor and a substrate,
one of a first output potential output from the first potential generator circuit and a second output potential output from the second potential generator circuit having temperature dependency, while the other having no temperature dependency.

20. The memory according to claim 19, wherein the first potential generator circuit includes:
   a BGR circuit for outputting a potential having temperature dependency; and
   first and second resistors series-connected between an output terminal of the BGR circuit and a ground point,
   the first output potential being output from a connection point of the first and second resistors,
   the BGR circuit including:
   a first current path composed of a first diode, third and fourth resistors, which are series-connected between the output terminal and the ground point;
   a second current path composed of a second diode and a fifth resistor, which are series-connected between the output terminal and the ground point;
   an operational amplifier having a first input terminal connected to a connection point of the third and fourth resistors, a second input terminal connected to a connection point of the second diode and the fifth resistor; and
   a MOS transistor having a gate connected to an output terminal of the operational amplifier, a source connected to a power supply terminal, and a drain connected to the output terminal thereof.

* * * * *